United States Patent
Von Skarczinski et al.

[11] Patent Number: 5,982,265
[45] Date of Patent: Nov. 9, 1999

[54] CURRENT-DETECTION COIL FOR A CURRENT TRANSFORMER

[75] Inventors: Albrecht Von Skarczinski; Hartmut Möncke, both of Berlin, Germany

[73] Assignee: Siemens Aktiengesellschaft, München, Germany

[21] Appl. No.: 08/875,954

[22] PCT Filed: Jan. 31, 1996

[86] PCT No.: PCT/DE96/00216

§ 371 Date: Feb. 12, 1998

§ 102(e) Date: Feb. 12, 1998

[87] PCT Pub. No.: WO96/24855

PCT Pub. Date: Aug. 15, 1996

[30] Foreign Application Priority Data

Feb. 9, 1995 [DE] Germany .................. 195 05 812

[51] Int. Cl.⁶ .................................................. H01F 27/28
[52] U.S. Cl. ........................ 336/229; 336/174; 336/200; 336/225
[58] Field of Search .............................. 336/229, 174, 336/225, 200, 82, 209, 205

[56] References Cited

U.S. PATENT DOCUMENTS

| | | | |
|---|---|---|---|
| 3,611,230 | 10/1971 | Maake | 336/120 |
| 4,268,810 | 5/1981 | Iwasa et al. | 336/205 |
| 4,706,020 | 11/1987 | Viertl et al. | 324/238 |
| 5,012,218 | 4/1991 | Haug et al. | 336/174 |
| 5,066,904 | 11/1991 | Bullock | 336/82 |
| 5,329,229 | 7/1994 | Chiba et al. | 324/248 |

FOREIGN PATENT DOCUMENTS

| | | |
|---|---|---|
| 0 339 189 | 11/1989 | European Pat. Off. . |
| 0 339189 | 11/1989 | European Pat. Off. ........ G01R 15/02 |
| 2 471 034 | 6/1981 | France . |
| 1 791 011 | 10/1971 | Germany . |
| 2 432 919 | 2/1976 | Germany . |
| 4 229 678 | 3/1994 | Germany . |

OTHER PUBLICATIONS

W.F. Ray et al., "Wide Bandwidth Rogowski Current Transducers Part I: The Rogowski Coil", EPE Journal, vol. 3, No. 1, Mar. 1993, pp. 51–59.

K. Heumann, "Messung und Oszillographische Aufzeichnung von Hohen Wechsel–und schnell veranderlichen Impulsstromen", Techn. Mitt. AEG–Telefunken 60 7, pp. 444–448.** No Date.

*Primary Examiner*—Lincoln Donovan
*Assistant Examiner*—Richard K. Lee
*Attorney, Agent, or Firm*—Kenyon & Kenyon

[57] ABSTRACT

A current-detection coil for a current transformer operating by the Rogowski principle has an insulating annular body made of a fiber-reinforced thermosetting plastic and manufactured as a single-piece solid body in a divisible mold. The parting line of a mold serving for manufacturing the annular body is in a flattened region on the outer periphery of the annular body and on a flattened region on the inner periphery. The annular body allows current transformers operating by the Rogowski principle to be manufactured that are capable of measuring in the entire range of currents that may occur and are resistant to mechanical and thermal stresses.

4 Claims, 1 Drawing Sheet

CURRENT-DETECTION COIL FOR A CURRENT TRANSFORMER

FIELD OF THE INVENTION

The present invention is directed to a current-detection coil for a current transformer operating according to the Rogowski principle.

BACKGROUND INFORMATION

A previously proposed current-detection coil is discussed in the British EPE Journal, vol. 3, No. 1, March 1993, pp. 51–59, where simple solid toroids or flexible cut-open coil bodies are proposed as annular body shapes. Furthermore, the use of circular cut-open plastic rings with a rectangular cross section, which can be bent for placement on a conductor and then return to their annular shape, is discussed therein. Each of the various annular bodies used in the current-detection coils discussed in the EPE Journal are used to form a Rogowski current transformer.

Although all of the current-detection coil embodiments of the EPE Journal can be made to exhibit good transfer characteristics, when they are mass-produced, however, virtually each unit will exhibit different transfer characteristics and therefore individual adjustments or electronic correction circuits must be used to achieve uniform results. The effect of small deviations of the geometry of Rogowski current transformer coils from the ideal shape on their transfer characteristics is known. One solution proposed is to use polished straight ceramic rods as winding supports. See German Journal Technische Mitteilungen AEG-Telefunken 60 (1970) 7, pp. 444–448. Because, however, a current-detection coil operating according to the Rogowski principle must surround a conductor on a closed path, the use of straight ceramic rods requires that a closed current-detection coil be made of four partial coils. In this case, the rectangular junction of the component parts causes considerable interference in the electromagnetic field. In order to remove this influence, the junction points are made field-free through the use of a shielding. The desired accuracy of the Rogowski current transformer is therefore associated with considerable expense for the manufacture of the current-detection coils.

SUMMARY OF THE INVENTION

The present invention is directed to a current-detection coil with an electrically insulating annular body as a support for a winding, the shape of the annular body cross section having flattened regions on the outer periphery and on the inner periphery.

An object of the present invention is to provide a current-detection coil of a Rogowski current transformer that exhibits a minimum spread of its characteristics and is suitable for both regular current measurement and triggering.

This object is achieved according to the present invention by designing the remaining regions of the cross section shape in an approximately semicircular shape. The annular body is made from a fiber-reinforced thermosetting plastic material as a solid single-piece body in a divisible mold, with the annular body being made without burrs and having no undercuts, and the winding is applied with a toroidal core winding machine.

The annular body provided according to the present invention is a very stable component having high heat resistance and a low thermal expansion factor. These characteristics result in minimum changes in the winding shape when, for example, the current-detection coil is applied to the main current paths of a low-voltage power switch, which can exhibit strong mechanical shocks and temperatures up to more than 100° C. The flattened cross section shape on the inner and outer periphery of the annular body contributes to this stability of the annular body by increasing the resisting moment against mechanical deformation. The burr-free manufacture of the annular body contributes to the desired uniformity and quality of the winding by the fact that the winding wire is in tight contact with the entire periphery of the annular body and therefore cannot be displaced or deformed.

An annular body having an outer diameter of approximately 80 to 100 mm, and wound with a single layer of lacquered copper wire that is approximately 0.05 to 0.1 mm thick is particularly well suited for application in low-voltage power switches in the medium-to-high rated current ranges.

If current-detection coils according to the present invention are used in multipole low-voltage power switches, the measurement accuracy in the adjacent phases can be influenced by the small distances between the respective conductors. This influence depends on the quality of the current-detection coil winding. According to the present invention, the interference of the adjacent conductors can be limited by dimensioning the infeed of the toroidal core winding machine so that a gap of max. 0.5% of the periphery of the annular body remains between the beginning and end of the winding for a given number of spires.

Burr-free manufacturing of the current-detection coil annular body can be facilitated according to the present invention by using a device in which the parting line of the mold is arranged in the flattened region of the cross-section shape of the annular body. Subsequent operations to remove any remaining burrs are therefore either unnecessary or can be limited to minimum effort.

DETAILED DESCRIPTION

Figure 1:
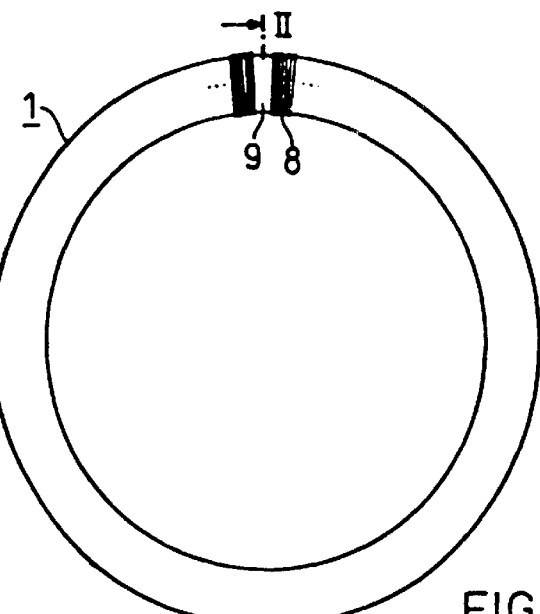
FIG. 1 shows a top view of an annular body of a current-detection coil according to the present invention.
Figure 2:
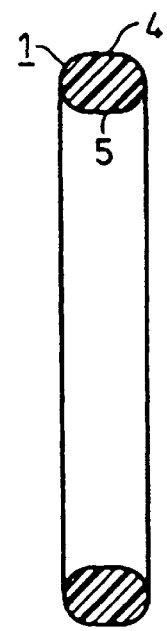
FIG. 2 shows a cross-section view of the annular support body.
Figure 3:
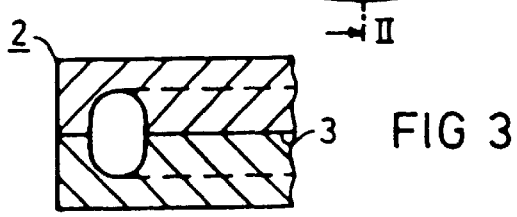
FIG. 3 shows a portion of an injection mold used for manufacturing the annular body according to the present invention.

FIGS. 1 and 2 show an annular body used as a support of a winding for a current transformer operating according to the Rogowski principle. Annular body 1 has a cross section shape that is flattened on an inner and outer periphery thereof, with the remaining profile being of an approximately semicircular shape. FIG. 3 shows a mold 2 that is used to manufacture annular body 1. In FIG. 3, the parting line 3 is located in the outer flattened region 4 and the inner flattened region 5 of the cross section shape of the annular body 1. The plastic injection compound that comprises annular body 1 is preferably a fiberglass-reinforced polyester thermosetting resin mix, which provides annular body 1 with good dimensional stability, resistance against deformation, and low thermal expansion under the temperatures occurring in operation.

The beginning and the end of winding 8, which is illustrated in FIG. 1, is applied to annular body 1 by using a toroidal core winding machine. As can be seen in FIG. 1, there is a very small gap 9 between the beginning and the end of the winding. This gap 9 is achieved for the given number of spires by a constant and suitably dimensioned infeed of the toroidal core winding machine used for the manufacture of the body 1. Since the distance of the windings is uniform along the entire annular body 1, and since gap 9 is very small in relation to the periphery of annular body 1, faults such as may occur due to magnetic fields of adjacent phases displacing one another in a low-voltage power switch have a minimum effect. As a result, the finished current-detection coil of the present invention is capable of handling a current range starting at a few amperes (A) and extending to approximately 150 kA. In particular, the lower measuring limit is not only determined by the characteristics of the current-detection coil, but also by the characteristics of an electronic analyzer circuit, to which the current-detection coil is connected. Therefore currents starting at approximately 50 A can be reliably measured.

Due to the position of parting line 3 in regions 4 and 5 of annular body 1 (FIG. 2), there is little tendency for burrs to form during manufacture. If, however, burrs are formed, they may be removed in a subsequent operation prior to applying the winding to annular body 1 with the toroidal core winding machine. If the entire range of currents that may occur is to be measured with a single winding, the winding must have a large number of spires. Therefore, a coil wire having a very small diameter must be used. An annular body with an outer diameter of 100 mm and a cross section of approximately 8×12 mm, for example, can have a winding with approximately three thousand spires using a 0.07 mm thick lacquered copper wire.

Figure 4:
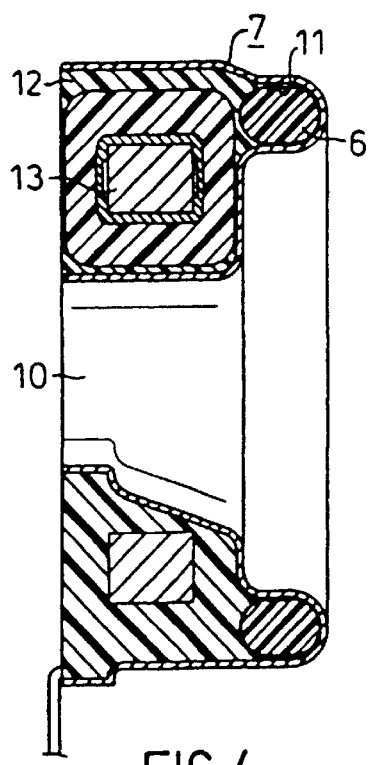
FIG. 4 shows a cross-section view of a current-detection coil arrangement.
Figure 5:
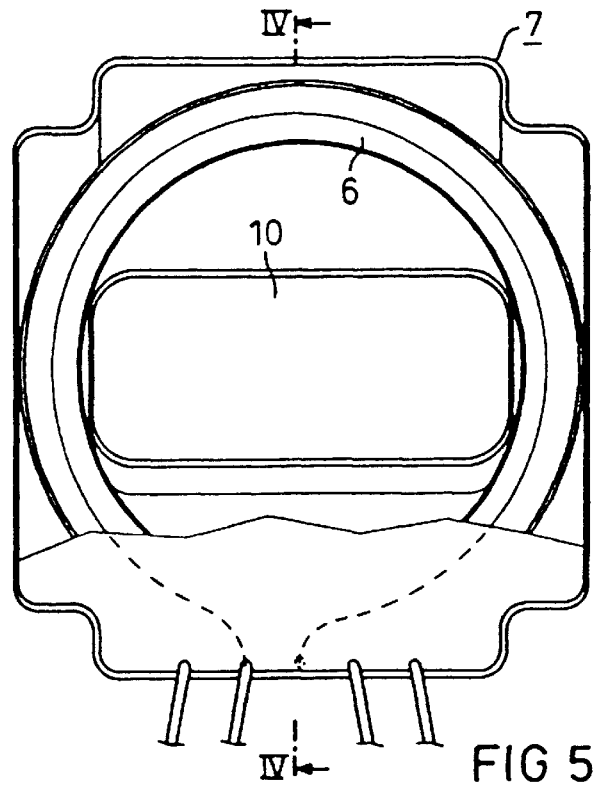
FIG. 5 shows a top view of a current-detection coil arrangement.

A finished current-detection coil 6 can be arranged as shown in FIGS. 4 and 5. The arrangement shown there has a housing 7 open on one side, which has a central window 10 for the passage of a rail-shaped conductor of a power switch. Current-detection coil 6 manufactured using an annular body 1 according to FIGS. 1 and 2 is in an annular space 11 of housing 7 and is fastened and covered with a sealing compound 12. The same sealing compound 12 serves for fastening an additional inductive current transformer 13, which is omitted from FIG. 5. Current transformer 13 can be used, for example, for providing auxiliary power for an electronic analyzer circuit to be connected to current-detection coil 6. Furthermore, an electronic triggering mechanism can be operated using current transformer 13.

What is claimed is:

1. A current-detection coil for use with a current transformer operating in accordance with the Rogowski principle, comprising:

an electrically insulating annular body; and a winding applied to the electrically insulating annular body, wherein:

a cross-section shape of the electrically insulating annular body includes a first flattened region located at an outer periphery of the electrically insulating annular body and a second flattened region located at an inner periphery of the electrically insulating annular body, the outer periphery and the inner periphery of the electrically insulating annular body are joined by approximately semicircular regions, the electrically insulating annular body comprises a fiber-reinforced thermosetting plastic formed as a single-piece solid body, the electrically insulating annular body is burr-free without undercuts, and the winding is applied to the electrically insulating annular body using a toroidal core winding process.

2. The current-detection coil according to claim 1, wherein the electrically insulating annular body is formed using a divisible mold having a parting line which is arranged on the first and second flattened regions.

3. A current-detection coil for use with a current transformer operating in accordance with the Rogowski principle, comprising:

an electrically insulating annular body; and a winding applied to the electrically insulating annular body, wherein:

a cross-section shape of the electrically insulating annular body includes a first flattened region located at an outer periphery of the electrically insulating annular body and a second flattened region located at an inner periphery of the electrically insulating annular body, the outer periphery and the inner periphery of the electrically insulating annular body are joined by approximately semicircular regions, the electrically insulating annular body comprises a fiber-reinforced thermosetting plastic formed as a single-piece solid body, the electrically insulating annular body is burr-free without undercuts, the winding is applied to the electrically insulating annular body using a toroidal core winding process, and the electrically insulating annular body has an outer diameter of approximately 80 to 100 mm and is tightly wound with a single layer of lacquered copper wire having a diameter of approximately 0.05 to 0.1 mm.

4. A current-detection coil for use with a current transformer operating in accordance with the Rogowski principle, comprising:

an electrically insulating annular body; and a winding applied to the electrically insulating annular body, wherein:

a cross-section shape of the electrically insulating annular body includes a first flattened region located at an outer periphery of the electrically insulating annular body and a second flattened region located at an inner periphery of the electrically insulating annular body, the outer periphery and the inner periphery of the electrically insulating annular body are joined by approximately semicircular regions, the electrically insulating annular body comprises a fiber-reinforced thermosetting plastic formed as a single-piece solid body, the electrically insulating annular body is burr-free without undercuts, the winding is applied to the electrically insulating annular body using a toroidal core winding process, and a gap between a beginning portion and an end portion of the winding has a width of no more than approximately 0.5% of the periphery of the electrically insulating annular body.

* * * * *